United States Patent [19]

Cordani

[11] Patent Number: 4,957,653

[45] Date of Patent: Sep. 18, 1990

[54] COMPOSITION CONTAINING ALKANE SULFONIC ACID AND FERRIC NITRATE FOR STRIPPING TIN OR TIN-LEAD ALLOY FROM COPPER SURFACES, AND METHOD FOR STRIPPING TIN OR TIN-LEAD ALLOY

[75] Inventor: John L. Cordani, Waterbury, Conn.

[73] Assignee: MacDermid, Incorporated, Waterbury, Conn.

[21] Appl. No.: 334,918

[22] Filed: Apr. 7, 1989

[51] Int. Cl.$^5$ .......................... C23F 1/00; C23G 1/02; C09K 13/06; C11D 7/08

[52] U.S. Cl. .................................. 252/142; 252/79.1; 252/79.2; 252/79.3; 252/79.4; 156/656; 156/666

[58] Field of Search ...................... 252/142, 79.1, 79.2, 252/79.3, 79.4; 156/656, 666

[56] References Cited

U.S. PATENT DOCUMENTS

| | | | |
|---|---|---|---|
| 3,677,949 | 7/1970 | Brindisi et al. | 252/79.4 |
| 3,926,699 | 12/1975 | Dixon | 156/3 |
| 3,990,982 | 9/1976 | Dixon | 252/79.3 |
| 4,004,956 | 1/1977 | Brindisi | 156/666 |
| 4,297,257 | 10/1981 | Elias et al. | 260/29.6 |
| 4,306,933 | 12/1981 | Da Fonte, Jr. | 156/644 |
| 4,374,744 | 3/1983 | Kawanabe et al. | 252/79.4 |
| 4,397,753 | 8/1983 | Czaja | 252/79.3 |
| 4,424,097 | 1/1984 | Lipka et al. | 156/656 |
| 4,439,338 | 3/1984 | Tomaiuolo et al. | 252/79.1 |
| 4,673,521 | 6/1987 | Sullivan et al. | 252/79.3 |
| 4,687,545 | 8/1987 | Williams et al. | 156/651 |
| 4,713,144 | 12/1987 | Schiller | 156/656 |

*Primary Examiner*—Paul Lieberman
*Assistant Examiner*—James M. Silbermann
*Attorney, Agent, or Firm*—St. Onge Steward Johnston & Reens

[57] ABSTRACT

A composition for stripping tin or solder, as well as any underlying copper-tin alloy, from copper surfaces, containing an alkane sulfonic acid, preferably methane sulfonic acid, and an inroganic nitrate, preferably ferric nitrate. The composition effects stripping without any appreciable formation of sludge or precipitate or suspended particles.

11 Claims, No Drawings

COMPOSITION CONTAINING ALKANE SULFONIC ACID AND FERRIC NITRATE FOR STRIPPING TIN OR TIN-LEAD ALLOY FROM COPPER SURFACES, AND METHOD FOR STRIPPING TIN OR TIN-LEAD ALLOY

BACKGROUND OF THE INVENTION

The present invention relates to compositions and methods for the stripping of tin or tin-lead alloys (i.e., solder) from a copper metal surface, and more particularly to compositions and methods for treating tin-coated or solder-coated copper surfaces in the manufacture of printed circuit boards to strip the tin or solder therefrom and expose the underlying copper metal.

In the course of manufacturing printed circuit boards, it is commonplace to deposit (e.g., by electroplating, immersion or other like processes) a layer of tin or tin-lead alloy (solder) on all or selected conductive copper surfaces of the board defining traces, through-holes, surrounding pad areas and the like, to serve, for example, as an etch resist in the subsequent etching away of other copper surfaces. By the same token, it is necessary to eventually strip the tin or tin-lead alloy from all or selected copper surfaces coated therewith, as is needed for example when it is desired to plate certain copper surfaces (e.g., contact fingers) with nickel and/or gold to improve conductivity or when it is desired to apply a solder mask over bare copper surfaces (SMOBC processes) or when it may be necessary simply to treat a reject piece in an effort to recover and re-use the underlying copper material. Also, while particularly apropos of printed circuit board manufacture, the need to strip away tin or tin-lead layers from copper surfaces also arises in other contexts where tin or tin-lead has been applied over a copper surface for decorative and/or functional purposes.

In addition, when copper metal surfaces are coated with tin or tin-lead alloys, a thin layer or film of copper-tin alloy (or intermetallic) typically forms at the layer interface, which film progressively increases in thickness with time. Accordingly, in processes designed to strip away the tin or tin-lead layer to expose copper metal, it is necessary to insure that this copper-tin intermetallic also is removed.

Compositions designed to strip tin and/or tin-lead coatings from copper surfaces are known in the art. One class of such compositions includes those based upon hydrogen peroxide and hydrofluoric acid or a fluoride. See, e.g., U.S. Pat. Nos. 3,926,699; 3,990,982; 4,297,257; 4,306,933; 4,374,744 and 4,673,521. Another class involves those employing nitro-substituted aromatic compounds as a principal ingredient, often in conjunction with an inorganic acid (see, e.g., U.S. Pat. Nos. 3,677,949; 4,004,956; and 4,397,753) or an organic acid (see U.S. Pat. No. 4,439,338 disclosing the use of alkylsulfonic acids). Other known stripper compositions and processes are described in U.S. Pat. Nos. 4,424,097 and 4,687,545. Nitric acid-based strippers also have long been used in the art. See, e.g., the discussion in U.S. Pat. No. 4,713,144, and the use therein of a composition of nitric acid, sulfamic acid and ferric nitrate.

Difficulties arise with all these known stripper compositions. The peroxide-fluoride system is very exothermic and, unless the solution is cooled continuously, temperatures are quickly reached where the peroxide decomposes. Also, the system is highly aggressive, running risk of attack on the copper and, as a result of the fluoride, attack of the glass typically present in the glass-reinforced substrates (e.g., epoxy-glass) used in printed circuit manufacture. Still a further problem with the use of peroxide-fluoride systems in the stripping of tin-lead alloys is the formation of a large volume of lead fluoride sludge which eventually irterferes with stripping, requires frequent cleaning of tanks and equipment, and poses significant waste disposal problems.

Strippers based upon nitro-substituted aromatic compounds are prone to redeposition of tin onto the copper from the stripping bath, which can be difficult to remove without excessive attack on the copper, and also are plagued by sludge formation. Nitric acid-based strippers form large volumes of sludge which, apart from the above-noted problems, can become adhered to the surfaces of the copper or to the printed circuit board substrate. Still further, most such systems require two-step processing in order to insure removal of copper-tin intermetallic residing on the copper surface after first removal of tin or tin-lead.

The formation of sludges and the highly corrosive nature of many of these stripper solutions also generally limits their practical use to processes where the surfaces to be treated are dipped or immersed in the solution, i.e., they are incompatible with the equipment which would be used to apply the solutions by a spraying technique.

SUMMARY OF THE INVENTION

It is a primary object of the present invention to provide a composition useful for treating a tin- or solder-coated copper surface to expose the underlying copper surface.

Another object of the invention is to provide a composition for stripping tin or tin-lead, and any underlying copper-tin alloy, from copper surfaces.

Yet another object of the invention is to provide a composition for stripping tin or tin-lead, and any underlying copper-tin alloy, from selected copper surfaces of a printed circuit board composed of copper areas on an insulating substrate.

Still another object of the invention is the provision of a composition of the type described which effects in a single application the rapid stripping of tin or tin-lead, and any underlying copper-tin alloy, from copper surfaces, without substantial attack on the copper and/or of the insulating substrate on which the copper resides, and without any significant degree of formation of sludge or precipitate or suspended by-products.

Another object of the invention is the provision of a composition of the type described which can be employed by techniques of immersion or spraying, and which employs ingredients which are environmentally sound.

Yet a further object of the invention is to provide a process for stripping tin or tin-lead, and any underlying copper-tin alloy, from copper surfaces.

These and other objects are achieved by the provision in the present invention of a composition comprised of an aqueous solution containing an alkane sulfonic acid and an inorganic nitrate, and more particularly containing from about 10 to about 1500 g/l alkane sulfonic acid and from about 1 g/l to about saturation inorganic nitrate.

In the preferred embodiment of the invention, the alkane sulfonic acid is methane sulfonic arid and the inorganic nitrate is ferric nitrate.

It has surprisingly been found that the foregoing composition is effective in rapidly removing tin or tin-lead, and underlying copper-tin alloy, from copper surfaces in a single application process (either immersion or spraying) without concomitant formation of any sludge or precipitate. Also of advantage is the achievement of this result using a composition which, for the time needed to effect the stripping, results in little if any attack on the underlying copper.

DETAILED DESCRIPTION OF THE INVENTION

In accordance with the invention, a composition and process are provided for stripping tin or tin-lead (solder) from copper surfaces, as well as stripping from the copper surface copper-tin alloy which has there formed.

As previously noted, the composition is particularly useful in the environment of printed circuit board manufacture where copper circuitry on an insulating substrate has been provided with a tin or tin-lead layer (e.g., by electroplating) incident to the manufacturing process, but then is required to be removed from all or some of the copper surfaces as a further step in manufacture and/or simply in an effort to reclaim copper from a reject board. Generally, the tin or tin-lead layer over the copper will be on the order of 0.0002 to 0.0004 inches thick (0.2 to 0.4 mils) in typical circuit board manufacturing processes. Moreover, a thin layer or film of copper-tin alloy or intermetallic will form between the copper and the tin or tin-lead layers, generally having a thickness of about 0.002 to about 0.004 mils, which thickness increases with time. The invention is generally applicable, however, to the removal of tin or tin-lead, and any underlying copper-tin alloy, from any copper surface on which the tin or tin-lead has previously been applied, whether or not in the context of printed circuit board manufacture and whether or not the copper in turn is associated with some underlying insulating or conductive substrate.

The invention is applicable to the treatment of copper surfaces on which essentially pure tin metal has been deposited or, as is more common, copper surfaces on which tin-lead alloy has been deposited. Tin-lead alloys are interchangeably referred to herein as solder, and may range in tin content from about 1 to 99% by weight, with the balance lead, although most solders commercially employed have a weight ratio of tin:lead of about 60:40. Many such alloys also contain relatively minor amounts of additional metallic species which do not in any event affect the efficacy of the stripping compositions of the invention.

The two essential ingredients of the stripper composition are an alkane sulfonic acid and an inorganic nitrate. Generally speaking, the inorganic nitrate acts upon the tin and/or tin-lead and/or copper-tin material to effect its dissolution from the copper surface, while the alkane sulfonic acid serves the function of forming highly water-soluble salts of the dissolved metals, but these ingredients also coact to achieve each of these functions in the expeditious manner and in the absence of precipitate formation which characterize the significant advantages of the composition.

The alkane sulfonic acid for use in the present invention is selected from any one or more compounds having the formula $RSO_3H$, where R is a lower alkyl group having from 1 to to 5 carbon atoms, and preferably 1 or 2 carbon atoms, i.e., methane sulfonic acid or ethane sulfonic acid, with methane sulfonic acid most preferred.

The amount of alkane sulfonic acid employed in the aqueous composition will be part depend upon the thickness of tin or tin-lead deposit being removed and the particular alkane sulfonic acid employed. Generally, however, and particularly for methane sulfonic acid, this component will be present in the aqueous composition in an amount ranging from 1 to 100% by volume, more preferebly 10 to 50% by volume, and most preferably 10 to 30% by volume, based upon a 70% methane sulfonic acid aqueous solution, which is a form in which methane sulfonic acid commonly is sold. Obviously, however, other concentrations, including the anhydrous form of the acid, can be used in making up the composition, and the above-stated ranges for the 70% concentration can be readily converted to ranges for other concentrations. Stated in terms of grams of anhydrous alkane sulfonic acid per liter of the overall stripper composition, the concentrations generally will be from about 10 to about 1500 g/l, more preferably from about 95 to about 470 g/l, and most preferably from about 95 to about 285 g/l.

The other essential ingredient of the aqueous stripper composition is an inorganic nitrate, such terminology being used herein to include nitric acid. Typically such inorganic nitrates are nitric acid, ferric nitrate, and the like, which can be used alone or in admixture in the aqueous composition. Ferric nitrate is preferred in this regard, and is available commercially in a variety of concentrated aqueous solutions (e.g., 45% anhydrous ferric nitrate) or as hydrated crystals. Typically, the amount of ferric nitrate employed in the stripper composition is expressed in terms of anhydrous ferric nitrate, and will range from about 1 g/l up to saturation in the composition, preferably from about 3 g/l to about 150 g/l and most preferably from about 30 g/l to about 60 g/l. Generally speaking, these same ranges can be employed for other inorganic nitrates, including nitric acid.

In the most preferred embodiments of the invention, the aqueous stripping composition will contain, in addition to water, only two ingredients, i.e., a single alkane sulfonic acid and a single inorganic nitrate, and in the most preferred embodiment the ingredients will be methane sulfonic acid and ferric nitrate.

For employing the aqueous stripping composition to treat tin or solder-coated copper surfaces to remove the tin or solder therefrom, along with any copper-tin film, so as to expose the copper metal, the surfaces in question are either immersed in the aqueous composition or the composition is sprayed on the surfaces. For typical tin or tin-lead and copper-tin layer thicknesses as earlier described, complete removal generally can be effected after from one to three minutes immersion, or upon spraying for anywhere from about 10 to 30 seconds. For spraying, the aqueous composition is typically continuously recirculated, and of course, for spraying or immersion processes, the aqueous composition can be used to treat a variety of tin- or tin-lead-coated copper surfaces simultaneously or sequentially until it has become exhausted to the point where stripping efficiency becomes uneconomically low.

Generally the aqueous stripping composition can be employed at room temperature, but preferred operation involves temperatures of from about 100° to about 150° F.

As previously noted, the aqueous stripping composition of the present invention possesses a number of significant advantages, most notably its ability to effect tin or tin-lead and copper-tin stripping from copper surfaces rapidly and efficiently, and over repeated cycles of use, without formation of sludge or precipitates. The stripping of both the tin or solder coating as well as the underlying copper-tin alloy is accomplished in a single step and without significant detrimental effect on the copper surface. The composition is stable on makeup and during shipping, storage and use, and neither employs nor generates in use environmentally problematic compounds.

The invention is further described and illustrated with reference to the following examples.

EXAMPLE I

An aqueous stripping composition was prepared containing 20% by volume of 70% methane sulfonic acid and 80 g/l ferric nitrate nonahydrate. The solution, heated to 110° F., was used to strip solder from solder-coated (0.3 mil) copper areas of a printed circuit board by both immersion and spray techniques. In the immersion method, clean copper metal was exposed after about three (3) minutes, while in the spraying method approximately 30 seconds were required. Use of the solution continued until about 100 g/l of solder had been dissolved therein, and no precipitate or sludge was evident in the solution.

EXAMPLE II

An aqueous stripping composition was prepared containing 50% by volume of 70% methane sulfonic acid and 150 g/l ferric nitrate nonahydrate and employed as in Example I. Stripping time was 1.5 minutes (immersion) and 10-15 seconds (spray). The process was continued until about 210 g/l solder had been dissolved therein, and again no precipitate or sludge was evident.

EXAMPLE III

As a means for comparing the efficacy of the stripping composition of the present invention against other stripping compositions known in the art, the procedure of Example I was followed using an aqueous composition containing 100 g/l methanesulfonic acid, 20 g/l sodium m-nitrobenzene sulfonate and 20 g/l thiourea (see U.S. Pat. No. 4,439,338). While the composition was effective in stripping solder from the copper surface, an excessive volume of sludge (believed to be a tin (IV) complex) formed in the compositior. In addition, as the composition aged and absorbed more metals into solution, yellow crystals (believed to be an insoluble tin-thiourea complex) were found to precipitate on the stripped copper surface.

Although the invention has been described with reference to particular features and embodiments, it will be understood that these are not intended as limitations upon the scope of the invention as defined in the appended claims.

What is claimed is:

1. A composition for stripping tin or tin-lead alloy, and any underlying copper-tin alloy, from a copper surface, without bringing about significant formation of sludge, precipitate or suspended by-products, comprising an aqueous solution of an alkane sulfonic acid and ferric nitrate, each in amounts effective to strip said tin or tin-lead alloy, and any said underlying copper-tin alloy, from said copper surface without bringing about significant formation of sludge, precipitate or suspended by-products wherein said amounts are from about 10 to about 1500 g/l for said alkane sulfonic acid from about 1 g/l to saturation for said ferric nitrate.

2. The composition according to claim 1 wherein said alkane sulfonic acid is selected from the group consisting of methane sulfonic acid, ethane sulfonic acid, and mixtures thereof.

3. The composition according to claim 1 wherein said composition further comprises nitric acid.

4. A composition for stripping tin or tin-lead alloy, and any underlying copper-tin alloy, from a copper surface, without bringing about significant formation of sludge, precipitate or suspended by-produces, consisting essentially of an aqueous solution of an alkane sulfonic acid and ferric nitrate, each in amounts effective to strip said tin or tin-lead alloy, and any said underlying copper-tin alloy, from said copper surface without bringing about significant formation of sludge, precipitate or suspended by-products wherein said amounts are from about 10 to about 1500 g/l for said alkane sulfonic acid and from about 1 g/l to saturation for said ferric nitrate.

5. The composition according to claim 4 wherein said alkane sulfonic acid is selected from the group consisting of methane sulfonic acid, ethane sulfonic acid and mixtures thereof.

6. A composition for stripping tin or tin-lead alloy, and any underlying copper-tin alloy, from a copper surface, without bringing about significant formation of sludge, precipitate or suspended by-produces, consisting of an aqueous solution of methane sulfonic acid and ferric nitrate, each in amounts effective to strip said tin or tin-lead alloy, and any said underlying copper-tin alloy, from said copper surface without bringing about significant formation of sludge, precipitate or suspended by-products wherein said amounts are from about 10 to about 1500 g/l for said alkane sulfonic acid and from about 1 g/l to saturation for said ferric nitrate.

7. A method for stripping tin or tin-lead alloy, and any underlying copper-tin alloy, from a copper surface, without bringing about significant formation of sludge, precipitate or suspended by-products, comprising contacting said surface with a composition comprised of an aqueous solution of an alkane sulfonic acid and ferric nitrate, each in amounts effective to strip said tin or tin-lead alloy, and any said underlying copper-tin alloy, from said copper surface without bringing about significant formation of sludge, precipitate or suspended by-products, for a time sufficient to strip said tin or tin-lead alloy, and any underlying copper-tin aloy, from said copper surface wherein said amounts are from about 10 to about 1500 g/l for said alkane sulfonic acid and from about 1 g/l to saturation for said ferric nitrate.

8. A method for stripping tin or tin-lead alloy, and any underlying copper-tin alloy, from a copper surface, without bringing about significant formation of sludge, precipitate or suspended by-products, comprising contacting said surface with a composition consisting essentially of an aqueous solution of an alkane sulfonic acid and ferric nitrate, each in amounts effective to strip said tin or tin-lead alloy, and any said underlying copper-tin alloy, from said copper surface without bringing about significant formation of sludge, precipitate or suspended by-products, for a time effective to strip said tin or tin-lead alloy, and any underlying copper-tin alloy, from said copper surface wherein said amounts are from about 10 to about 1500 g/l for said alkane sulfonic acid and from about 1 g/l to saturation for said ferric nitrate.

9. A method for stripping tin or tin-lead alloy, any underlying copper-tin alloy, from a copper surface, without bringing about significant formation of sludge, precipitate or suspended by-products, comprising contacting said surface with a composition consisting of methane sulfonic acid and ferric nitrate, each in amounts effective to strip said tin or tin-lead alloy, and any said underlying copper-tin alloy, from said copper surface without bringing about significant formation of sludge, precipitate or suspended by-products, for a time effective to strip said tin or tin-lead alloy, and any underlying copper-tin alloy, from said copper surface wherein said amounts are from about 10 to about 1500 g/l for said alkane sulfonic acid and from about 1 g/l to saturation for said ferric nitrate.

10. The method according to either of claims 7, 8 or 9 wherein said contacting is selected from the group consisting of immersing said surface in said solution and spraying said solution on said surface.

11. The method according to either of claims 7, 8 or 9 wherein said copper surface is present as a printed circuit board.

* * * * *

UNITED STATES PATENT AND TRADEMARK OFFICE
CERTIFICATE OF CORRECTION

PATENT NO. : 4,957,653
DATED : September 18, 1990
INVENTOR(S) : J.L.Cordani; K.Lane; Z.Biran; R.A.Letize It is certified that error appears in the above-identified patent and that said Letters Patent is hereby corrected as shown below:

On the title page item [75]:
Amend "Inventor: John L. Cordani, Waterbury, Conn." to --Inventor: John L. Cordani, Waterbury, Conn.; Karl Lane, Jerusalem, Israel; Zvi Biran, Petach Tikva, Israel; Raymond A. Letize, West Haven, Conn.--

Signed and Sealed this

Seventh Day of April, 1992

Attest:

HARRY F. MANBECK, JR.

*Attesting Officer*     *Commissioner of Patents and Trademarks*